(12) United States Patent
Shih

(10) Patent No.: US 6,734,034 B2
(45) Date of Patent: May 11, 2004

(54) TRANSISTOR AND ASSOCIATED DRIVING DEVICE

(75) Inventor: Po-Sheng Shih, Hsinchu (TW)

(73) Assignee: Hannstar Display Corporation, Taipei (TW)

(*) Notice: Subject to any disclaimer, the term of this patent is extended or adjusted under 35 U.S.C. 154(b) by 0 days.

(21) Appl. No.: 10/393,803

(22) Filed: Mar. 20, 2003

(65) Prior Publication Data

US 2003/0194838 A1 Oct. 16, 2003

Related U.S. Application Data

(62) Division of application No. 09/976,821, filed on Oct. 12, 2001, now Pat. No. 6,566,178.

(30) Foreign Application Priority Data

Apr. 30, 2001 (TW) .................................. 90110253 A

(51) Int. Cl.$^7$ .......................... H01L 21/00; H01L 21/84
(52) U.S. Cl. .......................... 438/30; 438/154; 438/948
(58) Field of Search .......................... 438/30, 151–166, 438/948

(56) References Cited

U.S. PATENT DOCUMENTS

| | | | | |
|---|---|---|---|---|
| 4,837,180 A | * | 6/1989 | Chao | 438/305 |
| 5,753,557 A | * | 5/1998 | Tseng | 438/303 |
| 5,866,448 A | * | 2/1999 | Pradeep et al. | 438/231 |
| 6,008,100 A | * | 12/1999 | Yeh et al. | 438/305 |
| 6,069,046 A | * | 5/2000 | Gardner et al. | 438/305 |

* cited by examiner

Primary Examiner—Richard A. Booth
(74) Attorney, Agent, or Firm—J. C. Patents

(57) ABSTRACT

A method of forming a thin film transistor and its associated driver. A polysilicon layer, a gate oxide layer and a gate layer are formed on a substrate. A photoresist layer comprising of a top section and a base section is formed over the gate layer. The top section of the photoresist layer patterns out a thin film transistor gate while the base section outside the top section patterns out a lightly doped region or undoped region on each side of the gate. Complementary metal-oxide-semiconductor drivers are formed on each side of the thin film transistor.

14 Claims, 6 Drawing Sheets

US 6,734,034 B2

TRANSISTOR AND ASSOCIATED DRIVING DEVICE

CROSS-REFERENCE TO RELATED APPLICATION

This application is a divisional application of, and claims the priority benefit of, U.S. application Ser. No. 09/976,821 filed on Oct. 12, 2001 now U.S. Pat. No. 6,566,178.

BACKGROUND OF THE INVENTION

1. Field of Invention

The present invention relates to a method of manufacturing a thin film transistor and associated driving device. More particularly, the present invention relates to a method of manufacturing a thin film transistor and associated driving device by forming a photoresist layer having a base section and a top section. The top section patterns out thin film transistor's gate while the base section patterns out a lightly doped drain (LDD) or undoped region so that one less masking step is required.

2. Description of Related Art

Thin film transistors (TFTs) are now frequently used inside liquid crystal displays (LCD) and related products. In general, thin film transistors can be classified according to material types into two major groups, amorphous silicon thin film transistors and polysilicon thin film transistors. Although the amorphous thin film transistor generally has a lower leakage current, low field effect mobility often leads to a lower overall conductive current. On the other hand, although the polysilicon thin film transistor has a higher field-effect mobility and is able to produce a higher conductive current, leakage current is high, resulting in a small current on/off ratio ($I_{on}/I_{off}$) Hence, widespread application of polysilicon thin film transistors in wide area liquid crystal displays is difficult. To reduce leakage current in a thin film transistor, lightly doped drain structures are often formed on each side of the transistor gate.

FIGS. 1A through 1C are schematic cross-sectional views showing the steps for producing a conventional thin film transistor with lightly doped drain regions. First, as shown in FIG. 1A, an insulating substrate 100 is provided. A polysilicon layer 102, a gate oxide layer 104 and a gate layer 106a are sequentially formed over the insulating substrate 100. A patterned photoresist layer 108 is formed over the gate layer 106a.

As shown in FIG. 1B, the gate layer 106a is etched using the patterned photoresist layer 108 as a mask to form a gate electrode 106b. Thereafter, using the patterned photoresist layer 108 again as a mask, a light implantation 116 is carried out implanting n-type ions into the polysilicon layer 102 to form a lightly doped n-type region 110. The patterned photoresist layer 108 is removed.

As shown in FIG. 1C, another patterned photoresist layer 112 is formed over the gate electrode 106b and the lightly doped n-type regions 110 on each side. Using the patterned photoresist layer 112 as a mask, a heavy implantation 118 is conducted, implanting n-type ions into the lightly doped n-type regions 110 to form a heavily doped n-type region 114 on each side of the gate 106b. The photoresist-covered lightly doped regions 110 form lightly doped drain (LDD) regions 110a. The pair of heavily doped n-type regions 114 serves as a source and a drain terminal of the transistor. Because the lightly doped regions 110a are formed using the patterned photoresist layer 112 as a mask, the width of the lightly doped region 110a may vary according to the alignment accuracy of the photoresist layer 112. Hence, an unsymmetrical source/drain terminal may be produced.

FIGS. 2A through 2C are schematic cross-sectional views showing the steps for fabricating a conventional thin film transistor with lightly doped structures and its associated driver. The process includes forming a pixel thin film transistor (TFT) and a complementary metal-oxide-semiconductor (CMOS) transistor on a substrate, with the CMOS transistor serving as a driving device for the TFT.

As shown in FIG. 2A, an insulating substrate 200 is provided. The insulating substrate 200 includes a p-type thin film transistor region 200a, an n-type thin film transistor region 200b and a pixel thin film transistor region 200c. An oxide layer 201, a patterned polysilicon layer 202, a gate oxide layer 204 and a gate layer 206 are sequentially formed over the insulating substrate 200. A patterned photoresist layer 208 is formed over the gate layer 206. The gate layer 206 is etched to form a gate electrode 206a for the p-type thin film transistor, a gate electrode 206b for the n-type thin film transistor and a gate electrode 206c for the pixel thin film transistor. Thereafter, again using the patterned photoresist layer 208 as a mask, a light implantation 216 is conducted, implanting n-type ions into the polysilicon layer 202 to form lightly doped n-type regions 210. The patterned photoresist layer 208 is finally removed.

As shown in FIG. 2B, another patterned photoresist layer 212 is formed over the p-type thin film transistor region 200a, the pixel thin film transistor gate 206c and the lightly doped n-type region 210 on each side of the gate 206c. A heavy implantation 218 is conducted implanting n-type ions into the exposed lightly doped n-type regions 210 to form heavily doped n-type regions 214.

As shown in FIG. 2C, yet another patterned photoresist layer 213 is formed over the n-type thin film transistor region 200b and the pixel thin film transistor region 200c. A heavy implantation 220 is conducted implanting p-type ions into the exposed lightly doped n-type region 210 to form heavily doped p-type regions 222.

In a conventional single thin film transistor or array production, at least two photo masks are required. One photomask is used for patterning out various gate electrodes and forming various lightly doped regions through a light implantation. A second photomask is formed over the gate electrodes (the pixel thin film transistor gate) and the sides of the gate electrodes for patterning out the lightly doped drain regions. Since the lightly doped drain regions and the gate electrodes are not formed by a self-aligned process, any misalignment between the two masks may produce non-symmetrical source and drain terminals. Any non-symmetry in the lightly doped drains and the source/drain terminals is a major factor affecting the performance of the pixel thin film transistor.

In addition, quality of the array of thin film transistors on a substrate may vary in accordance with the alignment accuracy of each batch or block. Hence, exposure and alignment accuracy of both masking processes is critical to the ultimate quality of the thin film transistors.

SUMMARY OF THE INVENTION

Accordingly, one object of the present invention is to provide a method of forming a thin film transistor and associated driver by forming a photoresist layer having a base section and a top section. The top section patterns out thin film transistor's gate while the base section patterns out a lightly doped drain (LDD) or undoped region. Ultimately, one less masking step is required and both the lightly doped drain region and the gate electrode are self-aligned.

To achieve these and other advantages and in accordance with the purpose of the invention, as embodied and broadly described herein, the invention provides a method of forming a thin film transistor. First, a substrate is provided. A patterned polysilicon layer, a gate oxide layer and a gate layer are sequentially formed over the substrate. A photoresist layer is formed over the gate layer. The photoresist layer includes a base section and a top section with width of the base section greater than width of the top section. A portion of the gate layer is removed to expose the gate oxide layer using the photoresist layer as a mask. An ion implantation is carried out using the photoresist layer as a mask to form a first doped region. A pre-defined thickness is removed from the photoresist layer so that photoresist material outside the top section is completely removed, exposing the gate layer underneath. Finally, the exposed gate layer is removed to form a gate electrode. The aforementioned process saves a masking step and both the lightly doped region and the gate electrode are self-aligned. Since subsequent processing steps are identical to a conventional method, detailed description is omitted here.

This invention also provides a method of forming a thin film transistor and associated driver. The aforementioned method of forming a thin film transistor is applied to form a pixel thin film transistor over the substrate. Thereafter, a complementary metal-oxide-semiconductor (CMOS) driver is fabricated. The order of forming the pixel thin film transistor and the CMOS driver depends on actual processing requirements. The pixel thin film transistor may be fabricated before the CMOS driver or vice versa. In the fabrication of an array of pixel thin film transistors, one masking step is saved. Moreover, both the lightly doped regions and the gate electrodes are formed by a self-aligned process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
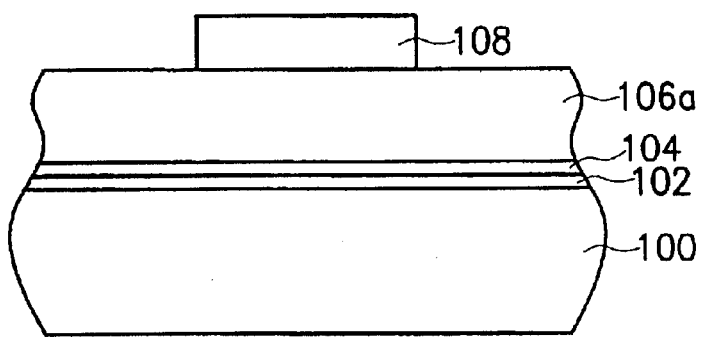
FIGS. 1A through 1C are schematic cross-sectional views showing the steps for producing a conventional thin film transistor with lightly doped drain regions.
Figure 1B:
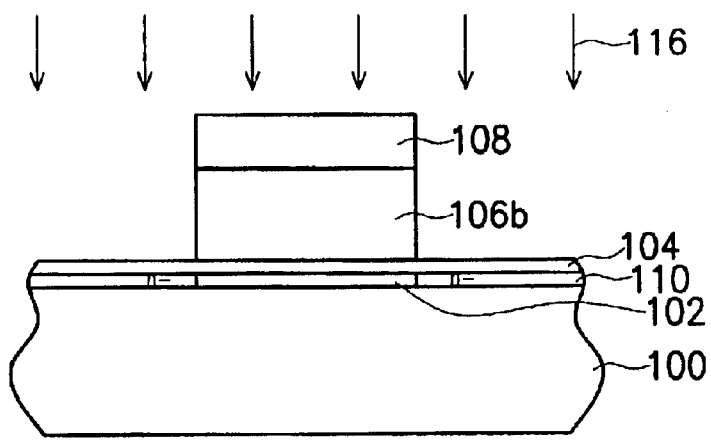
Figure 1C:
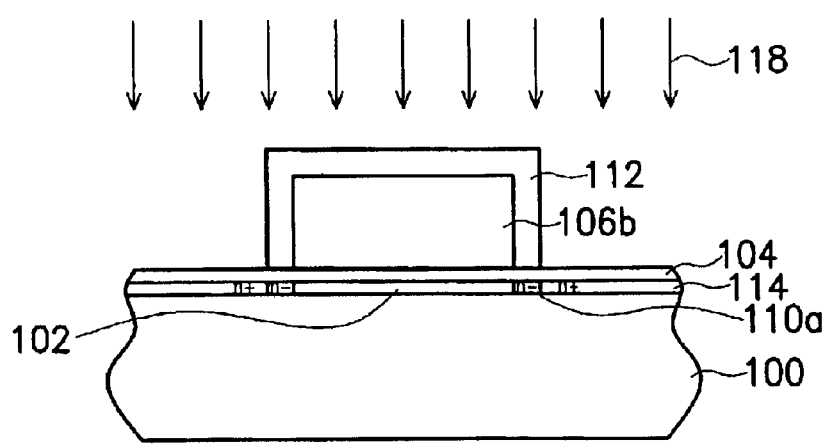
Figure 2A:
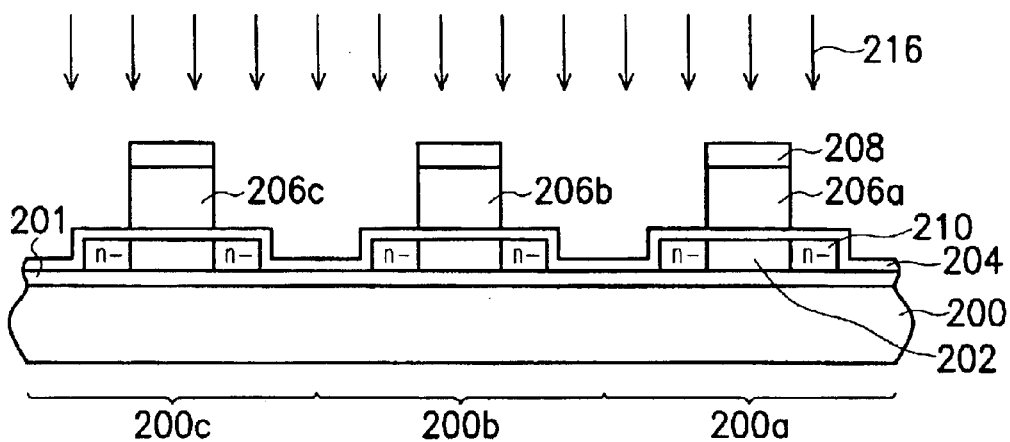
FIGS. 2A through 2C are schematic cross-sectional views showing the steps for fabricating a conventional thin film transistor with lightly doped structures and its associated driver.
Figure 2B:
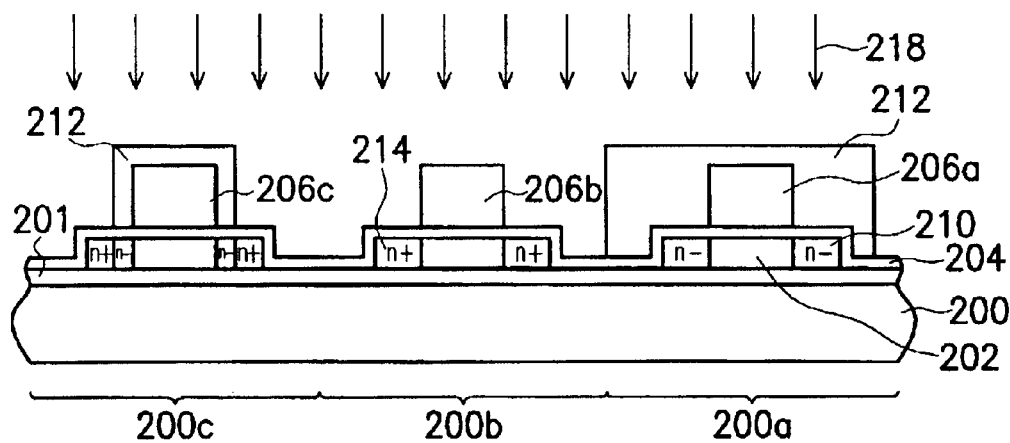
Figure 2C:
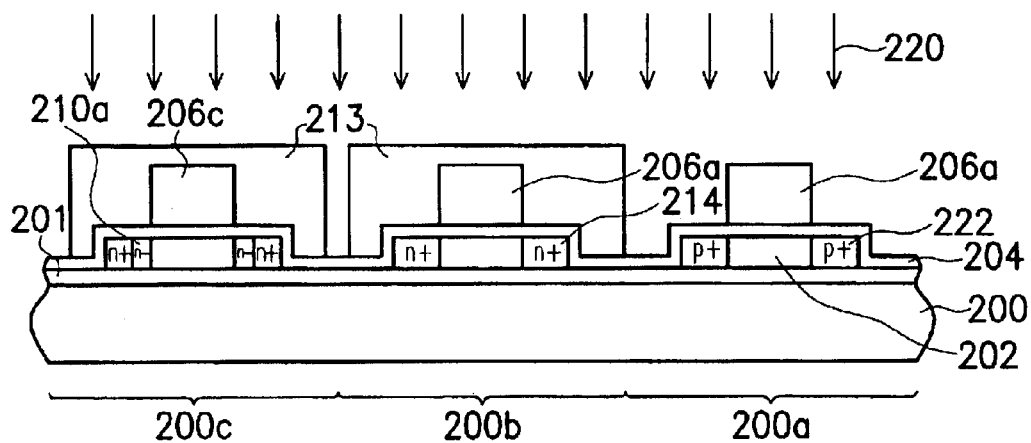

Reference will now be made in detail to the present preferred embodiments of the invention, examples of which are illustrated in the accompanying drawings. Wherever possible, the same reference numbers are used in the drawings and the description to refer to the same or like parts.

Figure 3A:
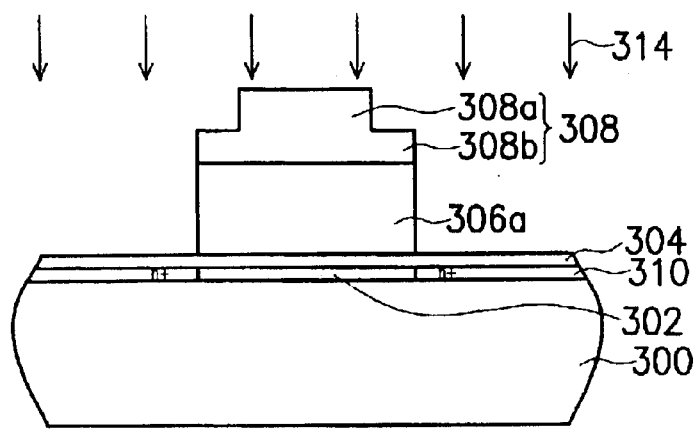
FIGS. 3A through 3C are schematic cross-sectional views showing the steps for producing a thin film transistor with lightly doped drain regions according to one preferred embodiment of this invention.
Figure 3B:
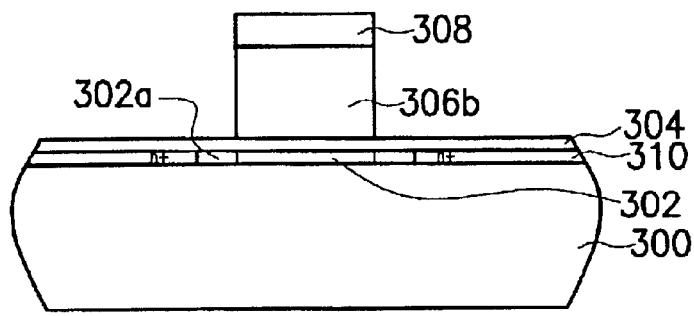
Figure 3C:
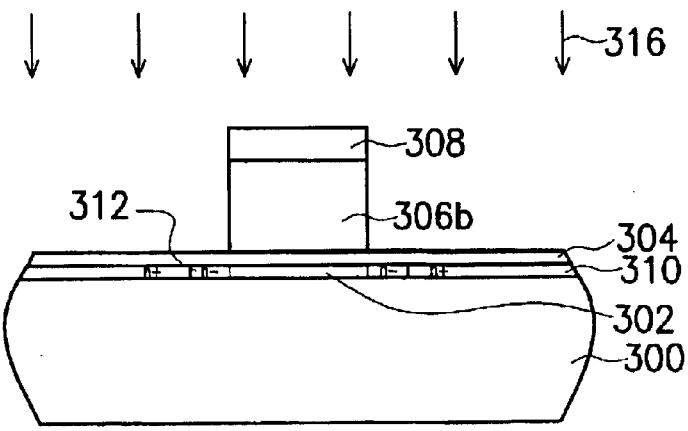

FIGS. 3A through 3C are schematic cross-sectional views showing the steps for producing a thin film transistor with lightly doped drain regions according to one preferred embodiment of this invention. As shown in FIG. 3A, an insulating substrate 300 is provided. A polysilicon layer 302, a gate oxide layer 304 and a gate layer 306a are sequentially formed over the insulating substrate 300. A patterned photoresist layer 308 having a top section 308a and a base section 308b is formed over the gate layer 306a. The patterned photoresist layer 308 later serves as a mask for forming a gate electrode 306b (shown in FIG. 3B) and a lightly doped drain region 312 (shown in FIG. 3C). The base section 308b of the photoresist layer 308 has a width greater than the top section 308a of the photoresist layer 308. The top section 308a of the photoresist layer 308 patterns out the gate electrode 306b (shown in FIG. 3B). The base section 308b outside the top section 308a patterns out the lightly doped drain regions 312 (shown in FIG. 3C).

A portion of the gate layer 306a is removed using the patterned photoresist layer 308 as a mask. A heavy implantation 314 is next carried out to form heavily doped regions 310 in the polysilicon layer 302. The heavily doped regions 310 can be heavily doped n-type regions, for example.

As shown in FIG. 3B, oxygen plasma ashing or another anisotropic etching process is conducted to remove a pre-defined thickness of the photoresist layer 308. Hence, the base section 308b outside the top section 308a is completely removed to expose the gate layer 306a underneath and a layer of the top section 308a is removed at the same time. Using the remaining photoresist layer 308 as a mask, the exposed gate layer 306a is removed to form the gate electrode 306b and an undoped region 302a on each side of the gate electrode 306b. Since the undoped region 302a on each side of the gate electrode 306b can provide some compensation for the heavily doped regions 310, the undoped region 302a can be utilized to remedy the leakage current problem in a thin film transistor.

As shown in FIG. 3C, most thin film transistor structures use the patterned photoresist layer 308 as a mask to perform a low concentration ion implantation 316 so that a lightly doped drain region 312 is formed within the undoped region 302a. The lightly doped drain region 312 also has a compensatory effect relative to the heavily doped region 310. Hence, the lightly doped region 312 is also capable of preventing leakage current. Therefore, both the undoped region 302a (in FIG. 3B) and the lightly doped region 312 (in FIG. 3C) can effectively prevent the formation of leakage current in the transistor.

In this invention, the width of the gate electrode and the width of the lightly doped drain region or the undoped region are patterned out using the same photomask. Since high precision photomask can now be easily manufactured, width and degree of symmetry in photomask region that corresponds to the lightly doped drain region or undoped region can be accurately controlled. In other words, width ($L_{LDD}$) of the lightly doped drain region or width ($L_{offset}$) of the undoped region on each side of the gate channel (having a width $L_{channel}$) will be identical.

Figure 4:
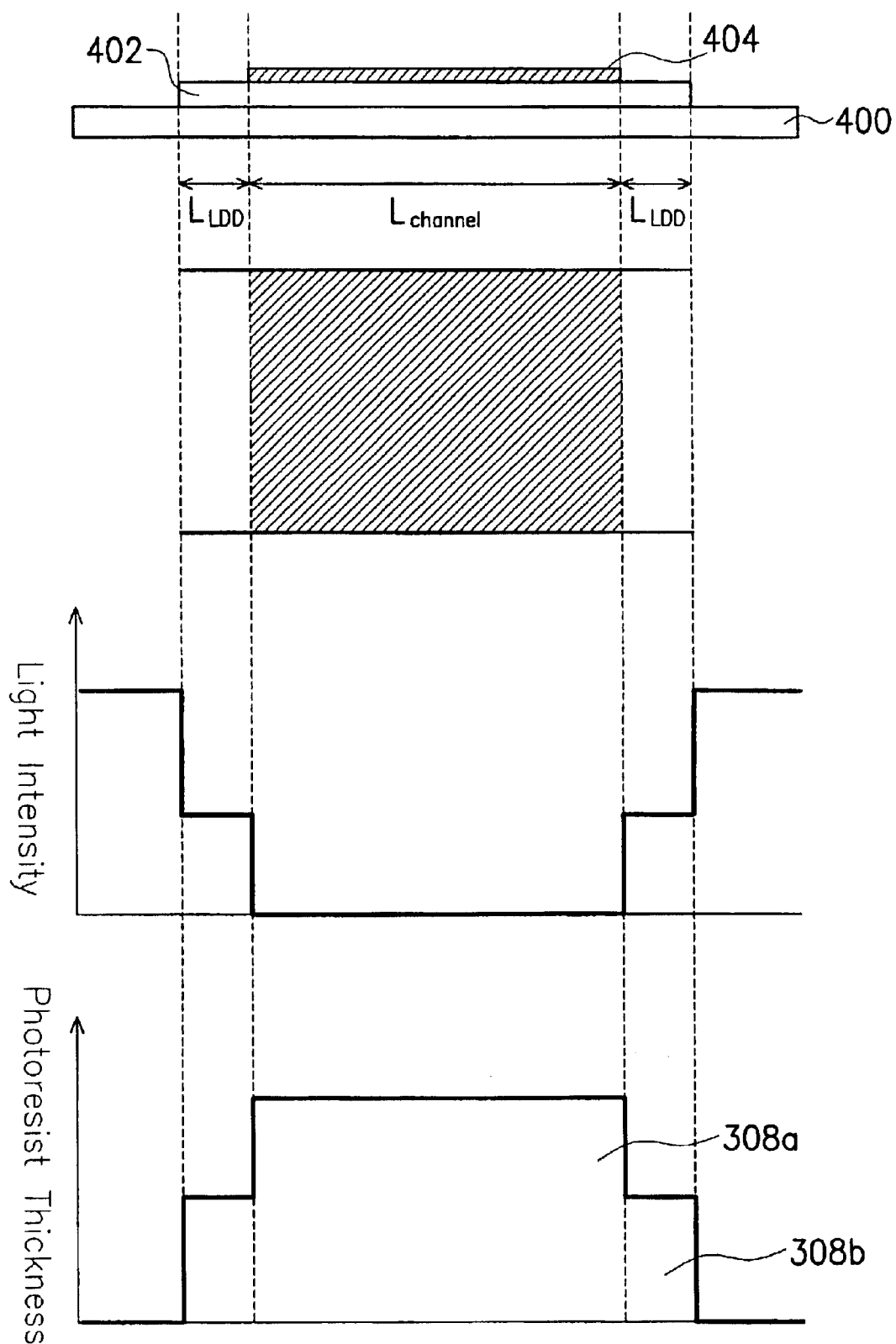
FIG. 4 is a sketch showing a photomask layer used in this invention and its corresponding exposure strength and photoresist thickness across the photomask layer.

FIG. 4 is a sketch showing a photomask layer used in this invention and its corresponding light intensity and photoresist thickness across the photomask layer. A photomask mainly includes a transparent substrate 400, a semi-transparent layer 402 over the transparent substrate 400 and a non-transparent layer 404 over the semi-transparent layer 402. The region underneath the non-transparent layer 404 is a light-blocked area having a width $L_{channel}$, for example. The non-transparent layer 404 patterns out the channel underneath the gate electrode. The semi-transparent layer 402 on each side of the non-transparent layer 404 has a width $L_{LDD}$ or $L_{offset}$, for example. The semi-transparent layer 402 patterns out the lightly doped drain region or the undoped region. For example, the light intensity of the non-transparent layer 404 is zero and the light intensity of the semi-transparent layer 402 is intermediate between zero and complete light transparence. Consequently, a photoresist layer having a top section 308a and a base section 308b is formed after photo-exposure and chemical development of the photoresist layer.

Figure 5A:
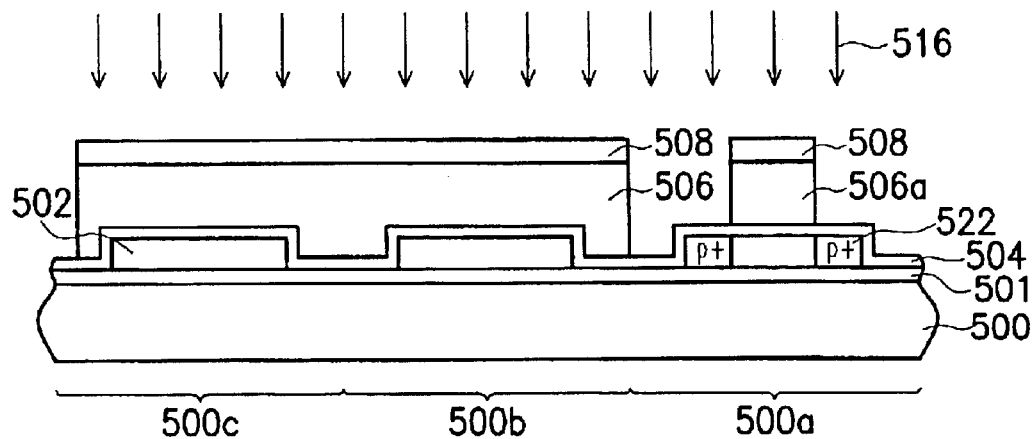
FIGS. 5A through 5C are schematic cross-sectional views showing the steps for fabricating a thin film transistor with lightly doped structures and its associated driver according to another preferred embodiment of this invention.
Figure 5B:
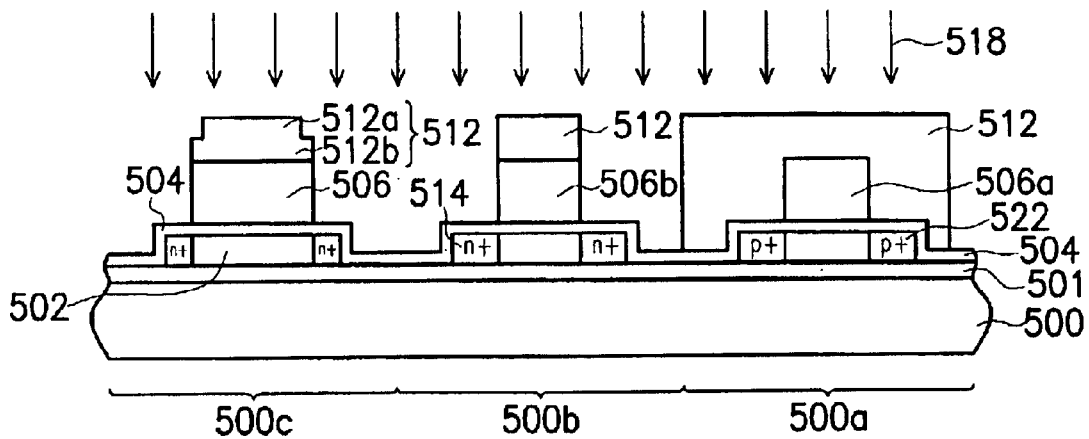
Figure 5C:
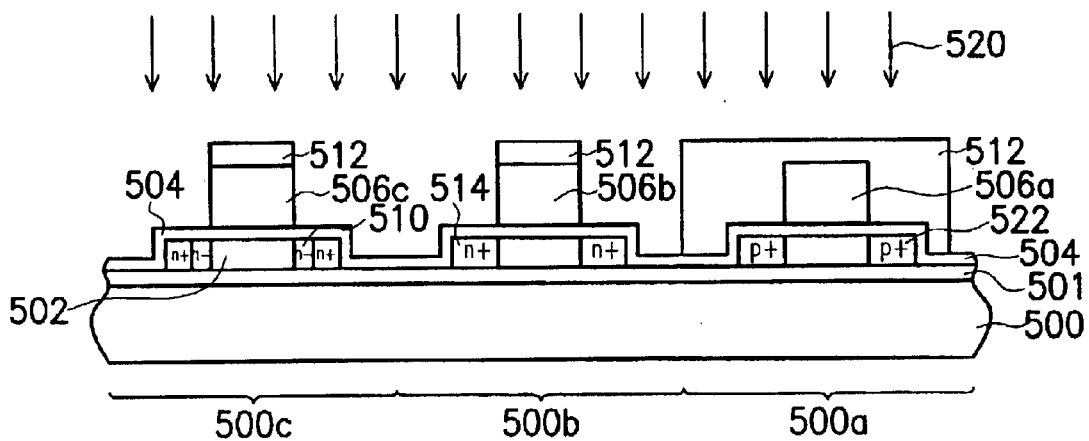

FIGS. 5A through 5C are schematic cross-sectional views showing the steps for fabricating a thin film transistor with lightly doped structures and its associated driver according to another preferred embodiment of this invention. Pixel thin film transistors (TFTs) and associated complementary metal-oxide-semiconductor (CMOS) drivers are simultaneously formed over a substrate to form a transistor array.

As shown in FIG. 5A, an insulating substrate 500 is provided. The insulating substrate 500 includes a p-type thin film transistor region 500a, an n-type thin film transistor region 500b and a pixel thin film transistor 500c. An oxide layer 501, a patterned polysilicon layer 502, a gate oxide layer 504 and a gate layer 506 are sequentially formed over the insulating substrate 500. A patterned photoresist layer 508 is formed over the n-type thin film transistor region 500b and the pixel thin film transistor region 500c. A portion of the gate layer 506 is removed using the patterned photoresist layer 508 as a mask to form a p-type thin film transistor gate 506a. A heavy implantation of p-type ions 516 is conducted using the patterned photoresist layer 508 as a mask to form p-type heavily doped regions 522. Here, fabrication of the p-type thin film transistor is completed.

As shown in FIG. 5B, the patterned photoresist layer 508 is removed and then another patterned photoresist layer 512 is formed over the p-type thin film transistor region 500a. Using the patterned photoresist layer 512 as a mask, an n-type thin film transistor gate 506b, a pixel thin film transistor gate 506c and a lightly doped drain region 510 (shown in FIG. 5C) on each side of the pixel gate 506c are formed. The patterned photoresist layer 512 above the pixel thin film transistor gate 506c includes a top section 512a and a base section 512b, for example. The base section 512b has a width greater than the top section 512a. The patterned photoresist 512 is formed, for example, by exposure, development and fixation as shown in FIG. 4. The top section 512a corresponds, for example, with the position of the pixel thin film transistor gate 506c. Similarly, the base section 512b outside the top section 512a corresponds, for example, with the positions of the lightly doped drain regions 510 (shown in FIG. 5C) on each side of the gate 506c.

A portion of the gate layer 506 is removed using the patterned photoresist layer 512 as a mask. Hence, a portion of the gate oxide layer 504 is exposed and an n-type thin film transistor gate 506b is formed. Again using the patterned photoresist layer 512 as a mask, a heavy implantation 518 of n-type ions is carried out to form n-type heavily doped regions 514 in the polysilicon layer 502 above the n-type thin film transistor region 500b and the pixel thin film transistor region 500c. Hence, fabrication of an n-type thin film transistor is completed.

As shown in FIG. 5C, a pre-defined thickness of the patterned photoresist layer 512 is removed so that the base section 512b outside the top section 512a is completely removed, exposing the gate layer 506 (not shown) underneath. Only a portion of patterned photoresist layer 512 in the top section 512a is removed. Thereafter, the exposed gate layer 506 (not shown) is removed to form a pixel thin film transistor gate 506c. To remove a layer of the patterned photoresist layer 512, an oxygen plasma ashing or other anisotropic etching process, for example, may be employed. Finally, a low concentration implantation 520 of n-type ions is conducted to form a lightly doped drain region 510 on each side of the pixel thin film transistor gate 506c.

Figure 6A:
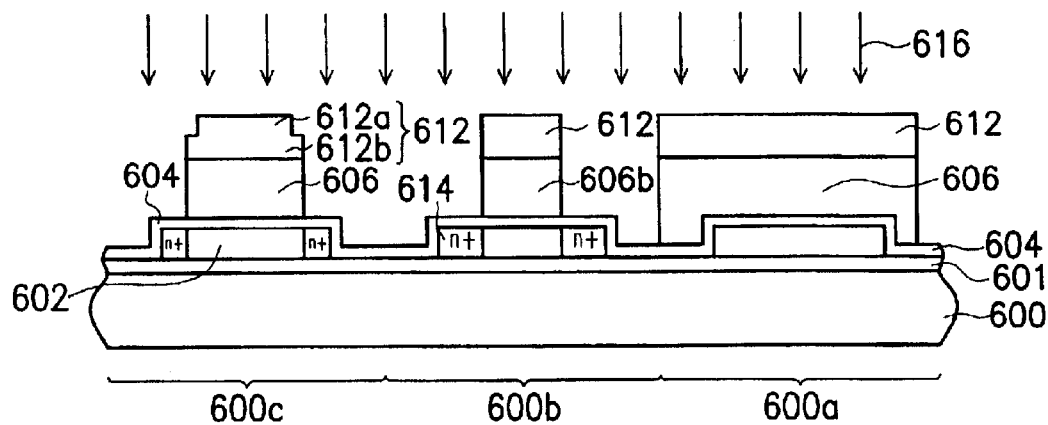
FIGS. 6A through 6C are schematic cross-sectional views showing the steps for fabricating a thin film transistor with lightly doped structures and its associated driver according to a second preferred embodiment of this invention.
Figure 6B:
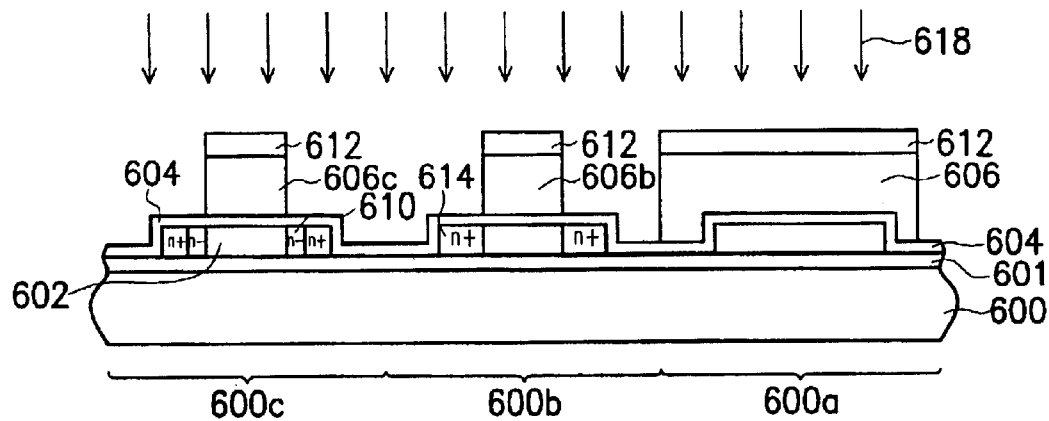
Figure 6C:
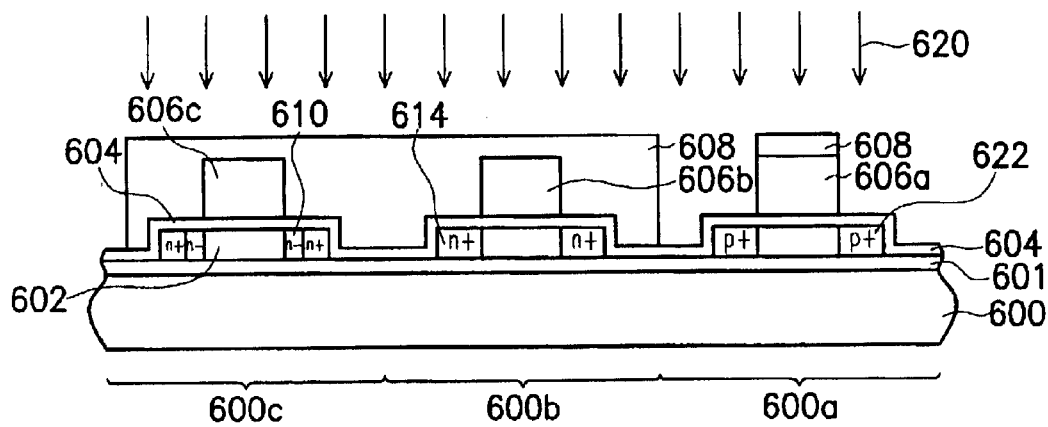

FIGS. 6A through 6C are schematic cross-sectional views showing the steps for fabricating a thin film transistor with lightly doped structures and its associated driver according to a second preferred embodiment of this invention. As shown in FIG. 6A, an insulating substrate 600 is provided. The insulating substrate 600 includes a p-type thin film transistor region 600a, an n-type thin film transistor region 600b and a pixel thin film transistor region 600c. An oxide layer 601, a patterned polysilicon layer 602, a gate oxide layer 604 and a gate layer 606 are sequentially formed over the insulating substrate 600. A patterned photoresist layer 612 is formed over the p-type thin film transistor region 600a. Using the patterned photoresist layer 612 as a mask, an n-type thin film transistor gate 606b, a pixel thin film transistor gate 606c and a lightly doped drain region 610 (shown in FIG. 6B) on each side of the gate 606c are formed. The patterned photoresist layer 612 above the pixel thin film transistor gate 606c includes a top section 612a and a base section 612b, for example. The base section 612b has a width greater than the top section 612a. The patterned photoresist 612 is formed, for example, by exposure, development and fixation as shown in FIG. 4. The top section 612a corresponds, for example, with the position of the pixel thin film transistor gate 606c. Similarly, the base section 612b outside the top section 612a corresponds, for example, with the positions of the lightly doped drain regions 610 (shown in FIG. 6B) on each side of the gate 606c.

A portion of the gate layer 606 is removed using the patterned photoresist layer 612 as a mask. Hence, a portion of the gate oxide layer 604 is exposed and an n-type thin film transistor gate 606b is formed. Again using the patterned photoresist layer 612 as a mask, a heavy implantation 616 of n-type ions is carried out to form n-type heavily doped regions 614 in the polysilicon layer 602 above the n-type thin film transistor region 600b and the pixel thin film transistor region 600c. Hence, fabrication of an n-type thin film transistor is completed.

As shown in FIG. 6B, a pre-defined thickness of the patterned photoresist layer 612 is removed so that the base section 612b outside the top section 612a is completely removed, exposing the gate layer 606 (not shown) underneath. Only a portion of patterned photoresist layer 612 in the top section 612a is removed. Thereafter, the exposed gate layer 606 (not shown) is removed to form a pixel thin film transistor gate 606c. To remove a layer of the patterned photoresist layer 612, an oxygen plasma ashing or other anisotropic etching process, for example, may be employed. A low concentration implantation 618 of n-type ions is conducted to form a lightly doped drain region 610 on each side of the pixel thin film transistor gate 606c.

As shown in FIG. 6C, a patterned photoresist layer 608 is formed over the n-type thin film transistor region 600b and the pixel thin film transistor region 600c. A portion of the gate layer 606 is removed using the patterned photoresist layer 608 as a mask to form a p-type thin film transistor gate 606a. A heavy implantation of p-type ions 620 is conducted using the patterned photoresist layer 608 as a mask to form p-type heavily doped regions 622. Fabrication of the p-type thin film transistor is complete.

In conclusion, principal advantages of the method of forming a thin film transistor and its associated driver according to this invention include:

1. In this invention, a photoresist layer having a top section and a base section is employed. The top section patterns out the gate electrode of the thin film transistor while the base section outside the top section patterns out the lightly doped drain region or undoped region on each side of the gate electrode. Hence, one less photo-masking step is required.
2. The photomask for fabricating the thin film transistor and associated driver is made using materials of different transparency. Utilizing the different degrees of transparency for light passing through the photomask, the gate electrode and lightly doped drain regions are patterned such that each lightly doped drain region has symmetrical width on each side of the gate electrode. Moreover, the lightly doped drain regions are able to align automatically with the gate electrode.
3. Unlike a conventional process requiring double photo-exposure that may incur alignment problems, different degrees of exposure provided by a single photomask fabricated using different light-transparency materials are used in this invention to control thickness of the photoresist layer. Positions of the lightly doped drain regions relative to the gate electrodes in each batch of substrates each containing an array of thin film transistors are nearly identical. Therefore, the array of thin film transistors on each substrate has an identical quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a thin film transistor and its associated driver, comprising:

providing a substrate, wherein the substrate is divided into a first type thin film transistor region, a second type thin film transistor region and a pixel thin film transistor region;

forming a patterned polysilicon layer over the substrate;

sequentially forming a gate oxide layer and a gate layer over the patterned polysilicon layer and the substrate;

forming a patterned first photoresist layer over the first type thin film transistor region, the second type thin film transistor region and the pixel thin film transistor region;

removing a portion of the gate layer to form a first type thin film transistor gate while using the first photoresist layer as a mask;

conducting a first ion implantation to form a first doped region in the polysilicon layer on each side of the first type thin film transistor gate;

removing the first photoresist layer;

forming a patterned second photoresist layer over the second type thin film transistor region, the pixel thin film transistor region and the first type thin film transistor region, wherein the second photoresist layer over the pixel thin film transistor region includes a top section and a base section with a width of the base section being greater than a width of the top section;

removing a portion of the gate layer to expose the gate oxide layer while using the second photoresist layer as a mask;

conducting a second ion implantation to form a second doped region in the polysilicon layer using the second photoresist layer as a mask;

removing a portion of the second photoresist layer such that photoresist material in the base section outside the top section is completely removed, exposing the gate layer underneath and removing a pre-defined thickness of photoresist material from the top section; and removing the exposed gate layer to form a pixel thin film transistor gate electrode.

2. The method of claim 1, wherein forming the patterned second photoresist layer over the pixel thin film transistor gate further includes:

forming a photoresist layer over the gate;

providing a photomask, wherein the photomask includes a non-transparent region and a semi-transparent region on each side of the non-transparent region;

conducting a photo-exposure using the photomask;

fixing the exposed photoresist layer using a chemical developer to form the patterned second photoresist layer with a top section and a base section.

3. The method of claim 1, wherein after forming the pixel thin film transistor gate, further includes conducting a third ion implantation to form a third doped region in the polysilicon layer on each side of the pixel thin film transistor gate.

4. The method of claim 3, wherein the second doped region and the third doped region contains the same type of ions.

5. The method of claim 3, wherein a dopant concentration in the third doped region is lower than a dopant concentration in the second doped region.

6. The method of claim 3, wherein the first doped region is a p-doped region while the second and the third doped region are n-doped regions.

7. The method of claim 3, wherein the first doped region is an n-doped region while the second and the third doped region are p-doped regions.

8. A method of forming a thin film transistor and its associated driver, comprising:

providing a substrate, wherein the substrate is divided into a first type thin film transistor region, a second type thin film transistor region and a pixel thin film transistor region;

forming a patterned polysilicon layer over the substrate;

sequentially forming a gate oxide layer and a gate layer over the patterned polysilicon layer and the substrate;

forming a patterned first photoresist layer over the second type thin film transistor region, the pixel thin film transistor region and the first type thin film transistor region, wherein the first photoresist layer over the pixel thin film transistor region includes a top section and a base section with a width of the base section being greater than a width of the top section;

removing a portion of the gate layer to expose the gate oxide layer while using the first photoresist layer as a mask;

conducting a first ion implantation to form a first doped region in the polysilicon layer while using the first photoresist layer as a mask;

removing a portion of the first photoresist layer such that photoresist material in the base section outside the top section is completely removed, exposing the gate layer underneath and a pre-defined thickness of photoresist material is removed from the top section;

removing the exposed gate layer to form a pixel thin film transistor gate electrode;

removing the first photoresist layer;

forming a patterned second photoresist layer over the first type thin film transistor region, the second type thin film transistor region and the pixel thin film transistor region;

removing a portion of the gate layer to form a first type thin film transistor gate using the second photoresist layer as a mask; and conducting a second ion implantation to form a second doped region on each side of the first type thin film transistor gate.

9. The method of claim 8, wherein forming the patterned first photoresist layer over the pixel thin film transistor gate further includes:
   forming a photoresist layer over the gate;
   providing a photomask, wherein the photomask includes a non-transparent region and a semi-transparent region on each side of the non-transparent region;
   conducting a photo-exposure using the photomask;
   fixing the exposed photoresist layer using a chemical developer to form the patterned first photoresist layer with a top section and a base section.

10. The method of claim 8, wherein after forming the pixel thin film transistor gate, further includes conducting a third ion implantation to form a third doped region in the polysilicon layer on each side of the pixel thin film transistor gate.

11. The method of claim 10, wherein the first doped region and the third doped region contains an identical type of ions.

12. The method of claim 10, wherein a dopant concentration in the third doped region is lower than a dopant concentration in the first doped region.

13. The method of claim 10, wherein the second doped region is a p-doped region while the first and the third doped region are n-doped regions.

14. The method of claim 10, wherein the second doped region is an n-doped region while the first and the third doped region are p-doped regions.

* * * * *